(12) United States Patent
Choi

(10) Patent No.: US 9,299,957 B2
(45) Date of Patent: Mar. 29, 2016

(54) METHOD OF MANUFACTURING ORGANIC LIGHT EMITTING DISPLAY APPARATUS BY PERFORMING PLASMA SURFACE PROCESS USING TARGET SPUTTERING APPARATUS

(71) Applicant: Samsung Display Co., Ltd., Yongin, Gyeonggi-Do (KR)

(72) Inventor: Su-Hyuk Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/096,587

(22) Filed: Dec. 4, 2013

(65) Prior Publication Data

US 2015/0028295 A1    Jan. 29, 2015

(30) Foreign Application Priority Data

Jul. 25, 2013 (KR) .......................... 10-2013-0088180

(51) Int. Cl.
- H01L 51/56 (2006.01)
- H01L 51/52 (2006.01)
- H01J 37/34 (2006.01)

(52) U.S. Cl.
CPC ............ *H01L 51/56* (2013.01); *H01J 37/3405* (2013.01); *H01J 37/3417* (2013.01); *H01J 37/3458* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 7,235,420 B2 | 6/2007 | Prakash et al. | |
| 8,382,966 B2 | 2/2013 | Choi et al. | |
| 2004/0018305 A1 | 1/2004 | Pagano et al. | |
| 2005/0239294 A1 | 10/2005 | Rosenblum et al. | |
| 2006/0216951 A1* | 9/2006 | Moro et al. .................... | 438/778 |
| 2007/0040501 A1 | 2/2007 | Aitken et al. | |
| 2009/0065741 A1 | 3/2009 | Walls et al. | |
| 2010/0193353 A1 | 8/2010 | Aitken et al. | |
| 2010/0243999 A1* | 9/2010 | Ishikawa ......................... | 257/40 |
| 2011/0151173 A1 | 6/2011 | Ramadas et al. | |
| 2013/0026035 A1 | 1/2013 | Choi et al. | |

FOREIGN PATENT DOCUMENTS

| | | |
|---|---|---|
| KR | 2002-0085320 A | 11/2002 |
| KR | 10-2008-0045217 A | 5/2008 |
| KR | 10-2011-0001180 A | 1/2011 |
| KR | 10-2011-0092965 A | 8/2011 |
| KR | 10-2012-0126266 A | 11/2012 |

OTHER PUBLICATIONS

Wesley Taylor, Technical Synopsis of Plasma Surface Treatments, Dec. 2009, University of Florida, Gainesville, FL.

* cited by examiner

*Primary Examiner* — Michael Jung
(74) *Attorney, Agent, or Firm* — Robert E. Bushnell, Esq.

(57) ABSTRACT

A method of manufacturing an organic light-emitting display apparatus includes preparing a deposition target in which an organic light-emitting portion is formed on a substrate, forming a pre-encapsulation layer for encapsulating the organic light-emitting portion by using a facing target sputtering apparatus, and forming an encapsulation layer by performing a plasma surface process on the pre-encapsulation layer by using the facing target sputtering apparatus. The facing target sputtering apparatus includes a chamber in which a mounting portion for accommodating the deposition target is provided, a gas supply portion facing the mounting portion and supplying gas to the chamber, a first target portion and a second target portion disposed in the chamber and facing each other, and an induced magnetic field coil surrounding the exterior of the chamber.

17 Claims, 6 Drawing Sheets

METHOD OF MANUFACTURING ORGANIC LIGHT EMITTING DISPLAY APPARATUS BY PERFORMING PLASMA SURFACE PROCESS USING TARGET SPUTTERING APPARATUS

CLAIM OF PRIORITY

This application claims the benefit of Korean Patent Application No. 10-2013-0088180, filed on Jul. 25, 2013, in the Korean Intellectual Property Office, the disclosure of which is incorporated herein in its entirety by reference.

BACKGROUND OF THE INVENTION

1. Field of the Invention

The present invention relates to an organic light-emitting display apparatus using a facing target sputtering apparatus and a method of manufacturing the organic light-emitting display apparatus, and more particularly, to an organic light-emitting display apparatus using a facing target sputtering apparatus to form an encapsulation layer, and to a method of manufacturing the organic light-emitting display apparatus.

2. Description of the Related Art

An organic light-emitting display apparatus includes an organic light-emitting device (OLED) including a hole injection electrode, an electron injection electrode, and an organic light-emitting layer formed between the hole injection electrode and the electron injection electrode. The organic light-emitting display apparatus is a self-light emitting display apparatus in which excitons are generated as holes injected by the hole injection electrode and electrons injected by the electron injection electrode are combined in the organic light-emitting layer and light is generated as the excitons are dropped from an excited state to a ground state.

Since the organic light-emitting display apparatus that is a self-light emitting display apparatus does not need a separate light source, the organic light-emitting display apparatus may be driven by a low voltage and may be manufactured to be light and thin. Also, the organic light-emitting display apparatus is highlighted as a next generation display apparatus due to its high quality characteristics such as a wide viewing angle, a high contrast, a fast response rate, etc.

Since the OLED is very weak relative to an external environment, for example, oxygen, moisture, etc., an encapsulation structure for encapsulating the OLED from the external environment is needed.

One of the film forming process technologies used to manufacture the above organic light-emitting display apparatus is a sputtering method. The sputtering method is widely known as a dry process technology having a wide applicability range. In the sputtering method, an inert gas such as argon (Ar) gas is introduced into a vacuum vessel and DC power or high frequency power is applied to a cathode including a sputtering target, thereby forming a film.

A magnetron type sputtering method in which a substrate and a target are arranged facing each other is generally known as one of the sputtering methods. According to the sputtering method, secondary electrons generated from a target surface or sputtering particles having high dynamic energy collide against an organic layer or an inorganic layer stacked on the OLED and may physically destroy the organic or inorganic layer. Accordingly, characteristics of the OLED may be deteriorated.

SUMMARY OF THE INVENTION

One or more embodiments of the present invention include an organic light-emitting display apparatus using a facing target sputtering apparatus and a method of manufacturing the organic light-emitting display apparatus.

Additional aspects will be set forth in part in the description which follows and, in part, will be apparent from the description, or may be learned by practice of the presented embodiments.

According to one or more embodiments of the present invention, a method of manufacturing an organic light-emitting display apparatus includes preparing a deposition target in which an organic light-emitting portion is formed on a substrate, forming a pre-encapsulation layer for encapsulating the organic light-emitting portion by using a facing target sputtering apparatus, and forming an encapsulation layer by performing a plasma surface process on the pre-encapsulation layer by using the facing target sputtering apparatus. The facing target sputtering apparatus includes a chamber in which a mounting portion for accommodating the deposition target is provided, a gas supply portion arranged facing the mounting portion and supplying gas to the chamber, a first target portion and a second target portion arranged in the chamber and facing each other, and an induced magnetic field coil arranged to surround the exterior of the chamber.

The first target portion and the second target portion may be arranged separate from each other, and the gas supplied by the gas supply portion may pass between the first target portion and the second target portion.

The induced magnetic field coil may be provided at a position corresponding to the first target portion and the second target portion.

Each of the first target portion and the second target portion may include a target plate for accommodating a sputtering target, a yoke arranged at a rear surface of the target plate, and a magnetic field generation unit arranged at a rear surface of the yoke.

The yoke may be formed of a ferromagnetic body or a paramagnetic body.

The accommodation unit may further include a temperature control unit for controlling a temperature of the deposition target.

The method may further include performing a plasma surface process on the organic light-emitting portion before the forming of the pre-encapsulation layer.

The forming of the encapsulation layer may further include performing an annealing process for thermally treating the pre-encapsulation layer.

The plasma surface process on the pre-encapsulation layer and the annealing process may be performed at the same time.

The encapsulation layer may include a low temperature viscosity transition (LVT) inorganic substance.

The encapsulation layer may include tine oxide.

The encapsulation layer may include a low temperature viscosity transition (LVT) inorganic substance, and a viscosity change temperature of the LVT inorganic substance is lower than a denaturation temperature of the organic light-emitting portion.

According to one or more embodiments of the present invention, an organic light-emitting display apparatus includes a substrate, an organic light-emitting portion comprising an organic light-emitting device on the substrate, and an encapsulation layer for encapsulating the organic light-emitting portion, in which the encapsulation layer is plasma-surface-processed and comprises a low temperature viscosity transition (LVT) inorganic substance.

The plasma surface process may be performed by a face target sputtering apparatus.

The encapsulation layer may include the LVT inorganic substance, and a viscosity change temperature of the LVT inorganic substance may be lower than a denaturation temperature of the organic light-emitting portion.

The encapsulation layer may include tine oxide.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
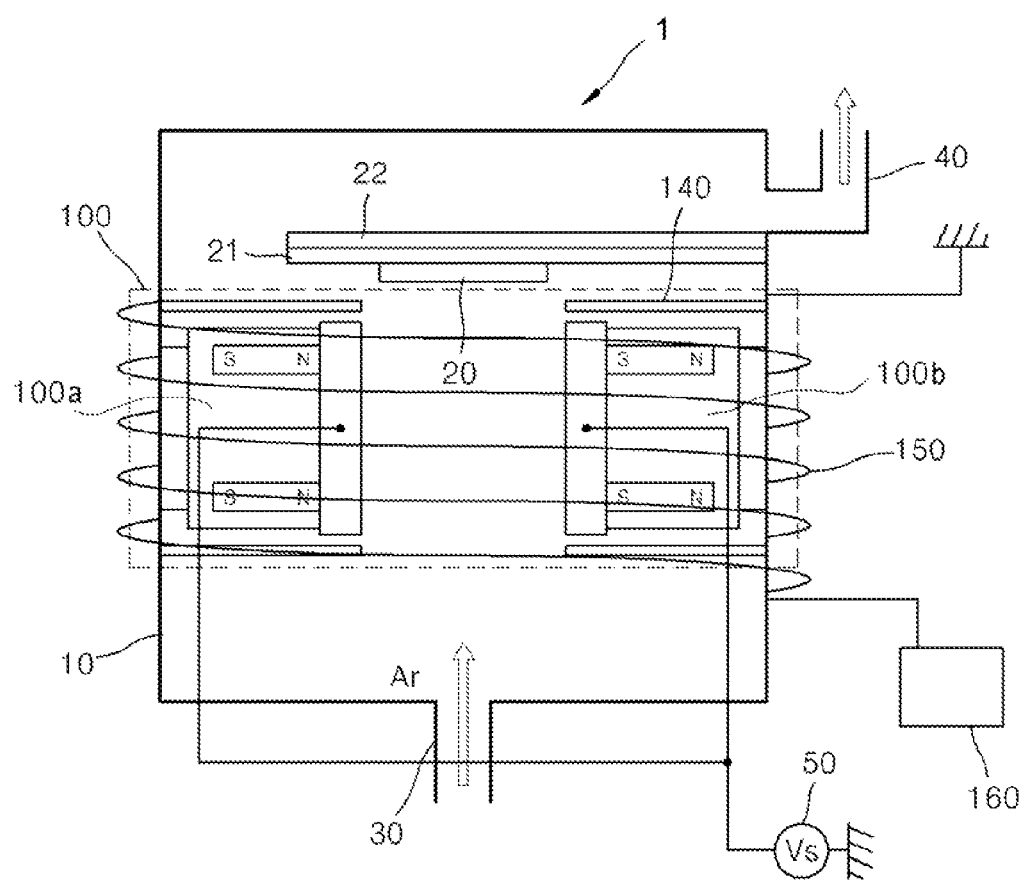
FIG. 1 is a schematic diagram illustrating a facing target sputtering apparatus according to an embodiment of the present invention.

Reference will now be made in detail to embodiments of the invention, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Also, the thickness or size of each layer illustrated in the drawings may be exaggerated for convenience of explanation and clarity.

In the following description, for example, when a layer is described to exist "on" or "above" another layer, the layer may exist directly on the other layer or a third layer may be interposed therebetween.

The terms used in the present specification are used for explaining a specific exemplary embodiment, and not for limiting the present inventive concept. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof. The terms such as "first" and "second" are used herein merely to describe a variety of constituent elements, but the constituent elements are not limited by the terms. The terms are used only for the purpose of distinguishing one constituent element from another constituent element.

When a certain embodiment is obtainable in a variety of ways, a particular process order may be performed differently from the described order. For example, two processes consecutively described may be actually performed simultaneously or in a reverse order relative to the described order.

FIG. 1 is a schematic diagram illustrating a facing target sputtering apparatus 1 according to an embodiment of the present invention.

Referring to FIG. 1, the facing target sputtering apparatus 1 according to the present embodiment includes a chamber 10 having a mounting portion 21 for mounting a deposition target 20, a gas supply portion 30 for supplying gas to the chamber 10, a sputtering target portion 100 including a first target portion 100a and a second target portion 100b arranged facing each other, and an induced magnetic field coil 150 surrounding the exterior of the chamber 10. The facing target sputtering apparatus 1 may further include a target shield portion 140, an exhaust hole 40, and a sputtering power portion 50.

The chamber 10 is a vacuum chamber and a pressure between 0.1 mTorr and 100 mTorr may be maintained in the chamber 10.

The gas supply portion 30 supplies gas to the interior of the chamber 10 and is arranged facing the mounting portion 21. The gas supply portion 30 supplies an inert gas such as argon (Ar) gas or various sorts of gases needed for film formation and thus plasma may be stably and efficiently generated during a sputtering process. Also, the gas supply portion 30 is arranged facing the mounting portion 21 so as to facilitate flow of plasma ions, atoms, and gases in the chamber 10 in a direction toward the deposition target 20. Accordingly, the plasma may easily arrive at the deposition target 20 during processing of a plasma surface.

The sputtering target portion 100 includes a pair of the first target portion 100a and the second target portion 100b facing each other. The structure of the sputtering target portion 100 will be described later with reference to FIGS. 2A and 2B.

The induced magnetic field coil 150 surrounds the exterior of the chamber 10. The induced magnetic field coil 150 may be arranged in correspondence to the position of the sputtering target portion 100.

When a magnetic field is changed by applying an electric potential from a radio frequency (RF) power portion 160 to the induced magnetic field coil 150, an induced magnetic field is generated in the chamber 10. Accordingly, a secondary induced current due to plasma ions, etc. is formed in the chamber 10, and thus high density plasma may be generated.

The induced magnetic field coil 150 may be provided to perform a plasma surface treatment on the deposition target 20. In a general facing target sputtering apparatus, a target and a deposition target do not face each other so that plasma may be difficult to arrive at the deposition target at a sputtering voltage at which film formation is not possible.

In the present embodiment, the induced magnetic field coil 150 enables the plasma to arrive at the deposition target 20 at a sputtering voltage at which film formation is not possible. Accordingly, the plasma surface processing on the deposition target 20 may be possible.

Since the induced magnetic field coil 150 is arranged outside the chamber 10, deterioration of performance may be prevented and maintenance and repair may be easily carried out. In other words, since the induced magnetic field coil 150 is arranged outside the chamber 10, there is no possibility that a sputter material is coated on a coil due to sputtering or that the coil is damaged by plasma. In addition, accessibility may be improved during maintenance and repair.

The target shield portion 140 protects the first target portion 100a and the second target portion 100b. In other words, the target shield portion 140 protects a portion other than front surfaces of sputtering targets 111a and 111b (see FIGS. 2A and 2B discussed below) from being sputtered. Also, the target shield portion 140 may function as a ground.

The exhaust hole 40 is used to exhaust the gas inside the chamber 10. The sputtering power portion 50 supplies sputtering power to the facing target sputtering apparatus 1 by using the target shield portion 140 as an anode (ground) and the sputtering targets 111a and 111b as a cathode. The power supplied by the sputtering power portion 50 may be a DC voltage or an AC voltage.

Figure 2A:
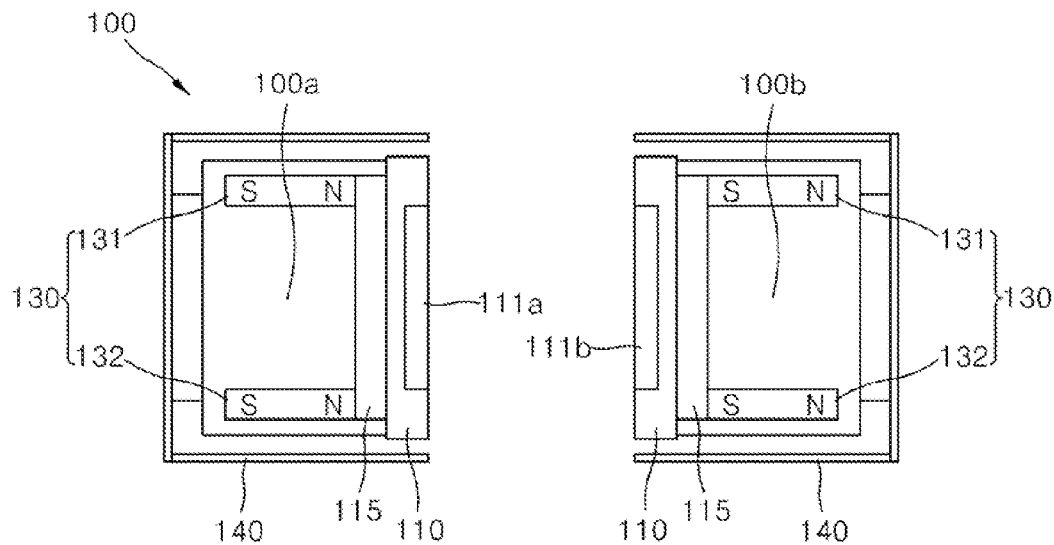
FIG. 2A illustrates a sputtering target portion according to an embodiment of the present invention.

FIG. 2A illustrates a sputtering target portion according to an embodiment of the present invention. Referring to FIG. 2A, the sputtering target portion 100 includes the first target portion 100a and the second target portion 100b. Each of the first and second target portions 100a and 100b, respectively, may include a target plate 110 in which each of the sputtering targets 111a and 111b is accommodated, a yoke 115 arranged on a rear surface of the target plate 110, and a magnetic field generation unit 130 arranged on a rear surface of the yoke 115.

The sputtering targets 111a and 111b are accommodated in the target plate 110 and are arranged facing each other in the first and second target portions 100a and 100b, respectively. Also, the sputtering targets 111a and 111b are formed of a material to be formed on the deposition target 20. The sputtering targets 111a and 111b may be formed of the same material or different materials according to the type of a material to be formed on the deposition target 20.

The magnetic field generation unit 130 generates a magnetic field in a space between the sputtering targets 111a and 111b facing each other of the first and second target portions 100a and 100b, respectively. The magnetic field generation units 130 of the first and second target portions 100a and 100b are arranged with different polarities.

The magnetic field generation unit 130 may be provided in multiple numbers. In some embodiments, the magnetic field generation unit 130 includes a first magnetic field generation unit 131 and a second magnetic field generation unit 132 which are arranged at opposite end portions of the yoke 115.

The yoke 115 causes the magnetic field generated by the magnetic field generation unit 130 to be more uniform. To this end, the yoke 115 may be formed of a material that may be magnetized by the magnetic field generation unit 130. In other words, the yoke 115 may be formed of a ferromagnetic material or a paramagnetic material. In some embodiments, the yoke 115 may be formed of any one of iron (Fe), cobalt (Co), nickel (Ni), and an alloy thereof.

Figure 2B:
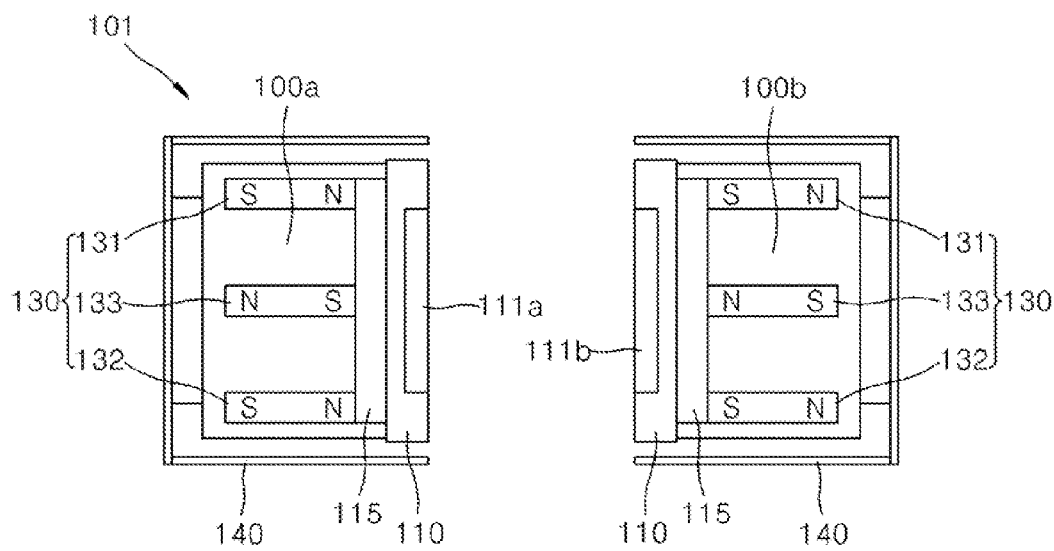
FIG. 2B illustrates a sputtering target portion according to another embodiment of the present invention.

FIG. 2B illustrates a sputtering target portion 101 according to another embodiment of the present invention. In FIG. 2B, the same reference numerals as those of FIG. 2A indicate the same elements and detailed descriptions about these elements will be omitted for simplification of explanation.

Referring to FIG. 2B, the sputtering target portion 101 is different from the sputtering target portion 100 of FIG. 2A in that the magnetic field generation unit 130 of the sputtering target portion 101 further includes a third magnetic field generation unit 133.

The third magnetic field generation unit 133 is arranged at the center of the target plate 110 and may generate a magnetic field in an opposite direction relative to the magnetic field generated by the first and second magnetic field generation units 131 and 132, respectively.

Such a structure of the magnetic field generation unit 130 may increase plasma confined between the first and second sputtering targets 111a and 111b. Accordingly, a usage rate of the first and second sputtering targets 111a and 111b may be improved.

The operation of the facing target sputtering apparatus 1 according to the present embodiments is described below.

Referring to FIG. 1, the deposition target 20 is accommodated in the mounting portion 21 of the chamber 10 and a sputtering gas such as Ar gas is supplied into the space between the first and second target portions 100a and 100b through the gas supply portion 30.

When the material formed on the deposition target 20 by the facing target sputtering apparatus 1 according to the present embodiment is a material including oxygen, that is, oxide, oxygen $O_2$ other than the Ar gas may be injected into the chamber 10.

The pressure in the chamber 10, in particular, the pressure of a sputtering gas between the first and second target portions 100a and 100b, may be 0.1 mTorr to 100 mTorr. When the pressure of a sputtering gas is higher than 100 mTorr, the content of a component in the sputtering gas such as Ar in a thin film formed on the deposition target 20 through the sputtering method increases so that characteristics of the thin film may be deteriorated. When the pressure of a sputtering gas is lower than 0.1 mTorr, it is difficult to form plasma in the space between the first and second target portions 100a and 100b so that efficiency of sputtering may be lowered.

Next, when power is simultaneously applied to the first and second sputtering targets 111a and 111b facing each other through the RF power portion 160, sputtering plasma is generated and confined in the space between the first and second target portions 100a and 100b by the magnetic field generated by the 130.

Next, high density plasma may be formed by applying RF power to the induced magnetic field coil 150. When an electric potential from the RF power portion 160 is applied to the induced magnetic field coil 150 to change a magnetic field, an induced magnetic field is generated in the chamber 10. Accordingly, a secondary induced current due to plasma ions may be formed in the chamber 10, and thus high density plasma may be generated.

The plasma is formed of gamma—electrons, negative ions, positive ions, etc. The electrons in the plasma form high density plasma while performing a rotate motion along magnetic lines of force connecting the first and second sputtering targets 111a and 111b, facing each other, of the first and second target portions 100a and 100b, and simultaneously, maintain the high density plasma while performing a reciprocation motion by the power applied to the first and second sputtering targets 111a and 111b.

In other words, all electrons or ions formed in the plasma or generated by the power perform a rotational motion along magnetic lines of force. Likewise, ion particles having electric charges, such as gamma-electrons, negative ions, positive ions, etc., perform a reciprocal motion along the magnetic lines of force, and thus particles charged to have high energy over 100 eV are accelerated toward the opposite target so as to be confined in the plasma formed in the space between the first and second target portions 100a and 100b.

The particles sputtered from any one of the first and second sputtering targets 111a and 111b and having high energy over 100 eV are accelerated toward the opposite target. Accordingly, the deposition target 20 placed perpendicular to the plasma formed in the space between the first and second target portions 100a and 100b are hardly damaged. A thin film is formed on the deposition target 20 by diffusion of neutral particles having relatively low energy.

Thus, compared to the case of using a magnetron type sputtering apparatus in which a substrate and a target are arranged facing each other, damage by plasma, that is, damage to the deposition target 20 due to the collision of particles having high energy, may be prevented and a thin film may be formed on the deposition target 20.

A plasma surface process may be performed without forming a film on the deposition target 20 by controlling the intensity of a voltage of the RF power portion 160. In some embodiments, when a voltage at which film formation is performed is V0, a voltage for the plasma surface process may be about 0.1 V0.

FIGS. 3A to 3E are cross-sectional views for explaining a method of manufacturing an organic light-emitting display apparatus according to embodiments of the present invention.

A variety of inorganic layers, for example, a first electrode 221 and a second electrode 222 (see FIG. 4), which may be applied to the organic light-emitting display apparatus 200, may be deposited by using the facing target sputtering apparatus 1 of FIG. 1 (see also FIG. 3E) according to the present embodiment.

In the present embodiment, forming an encapsulation film 270b including tin oxide, for example, is described as an organic light-emitting portion 250 is encapsulated by the facing target sputtering apparatus 1.

Figure 3A:
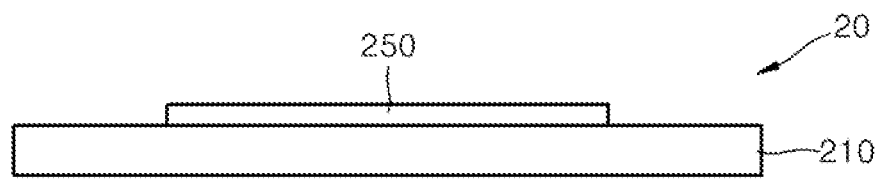
FIGS. 3A to 3E are cross-sectional views for explaining a method of manufacturing an organic light-emitting display apparatus according to embodiments of the present invention.

Referring to FIG. 3A, the deposition target 20 in which an organic light-emitting portion 250 is formed on a substrate 210 is prepared. The substrate 210 may be a glass-based substrate. However, the present invention is not limited thereto and the substrate 210 may include metal or plastic. The substrate 210 may be a flexible substrate capable of being bent.

Figure 4:
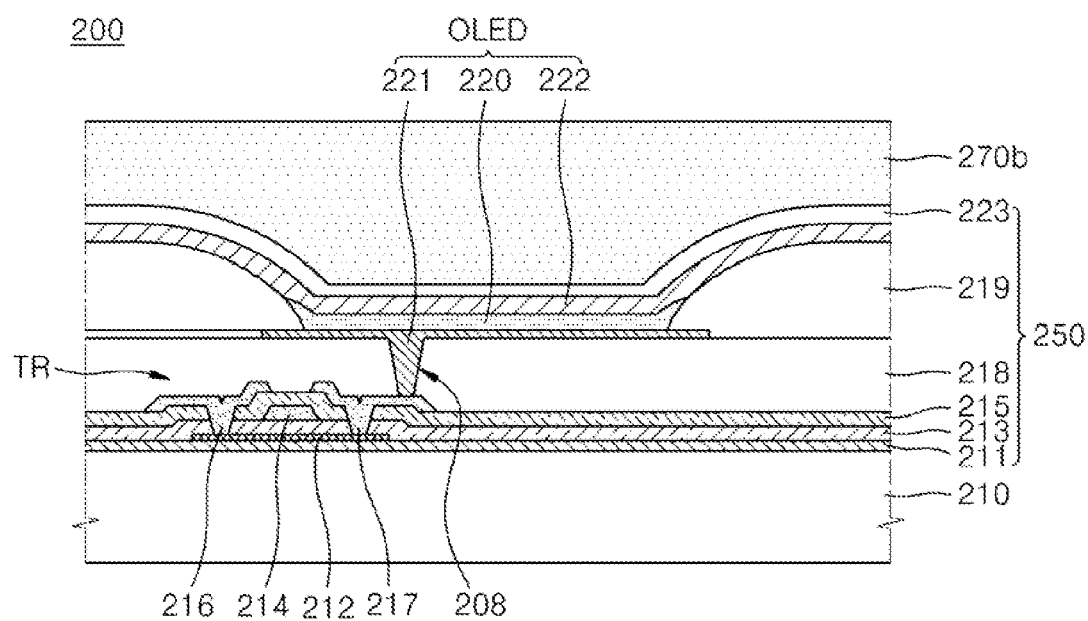
FIG. 4 is an enlarged cross-sectional view of a portion I of FIG. 3E.

The organic light-emitting portion 250 to embody an image includes an organic light-emitting device (OLED) having a structure in which the first electrode 221, an organic light-emitting layer 220, and the second electrode 222 are sequentially stacked above the substrate 210, as illustrated in FIG. 4. The organic light-emitting portion 250 may include a plurality of OLEDs. The organic light-emitting portion 250 will be described in detail with reference to FIG. 4.

Figure 3B:
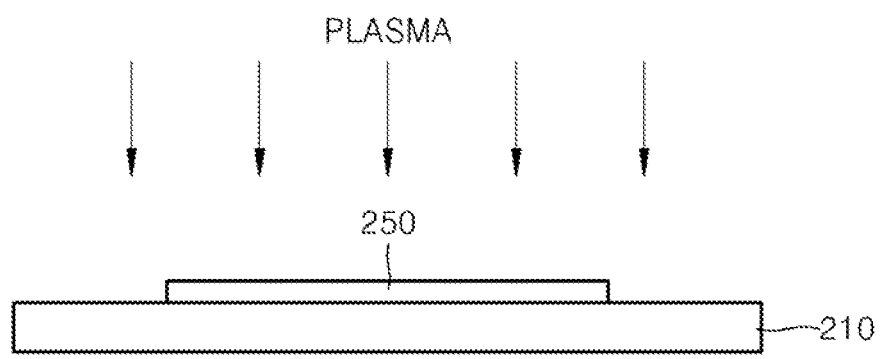

Referring to FIG. 3B, before a pre-encapsulation film 270a (see FIG. 3C) is formed, a plasma surface process may be performed on an upper surface of the organic light-emitting portion 250.

The facing target sputtering apparatus 1 according to the present embodiment includes the induced magnetic field coil 150, and the gas supply portion 30 is arranged facing the deposition target 20 so that the plasma surface process may be performed on the deposition target 20.

The first plasma surface process may be performed by the following operations.

First, the chamber 10 of FIG. 1 is turned to a vacuum state of $10^{-3}$ Pa or lower and then Ar gas or oxygen ($O_2$) gas is injected into the chamber 10 to maintain a pressure of 30-100 Pa.

Next, a voltage of the sputtering power portion 50 is adjusted to be within a range in which, although plasma is generated, the film formation by the first and second sputtering targets 111a and 111b is not performed on the deposition target 20. In other words, since the energy of the generated plasma is low, even when the plasma collides against the first and second sputtering targets 111a and 111b, the materials of the first and second sputtering targets 111a and 111b may not be sputtered out therefrom.

Next, as a voltage is applied to the induced magnetic field coil 150, the plasma arrives at the deposition target 20 and thus the plasma surface process is available. The plasma surface process may be performed for about 30 to 60 minutes.

As such, as foreign materials on the upper surface of the organic light-emitting portion 250 of FIG. 3B may be removed by the first plasma surface process, the upper surface of the organic light-emitting portion 250 is surface activated, and thus an adhesive force with the pre-encapsulation layer 270a to be deposited in a subsequent process may be improved. The first plasma surface process may be omitted in some cases.

Figure 3C:
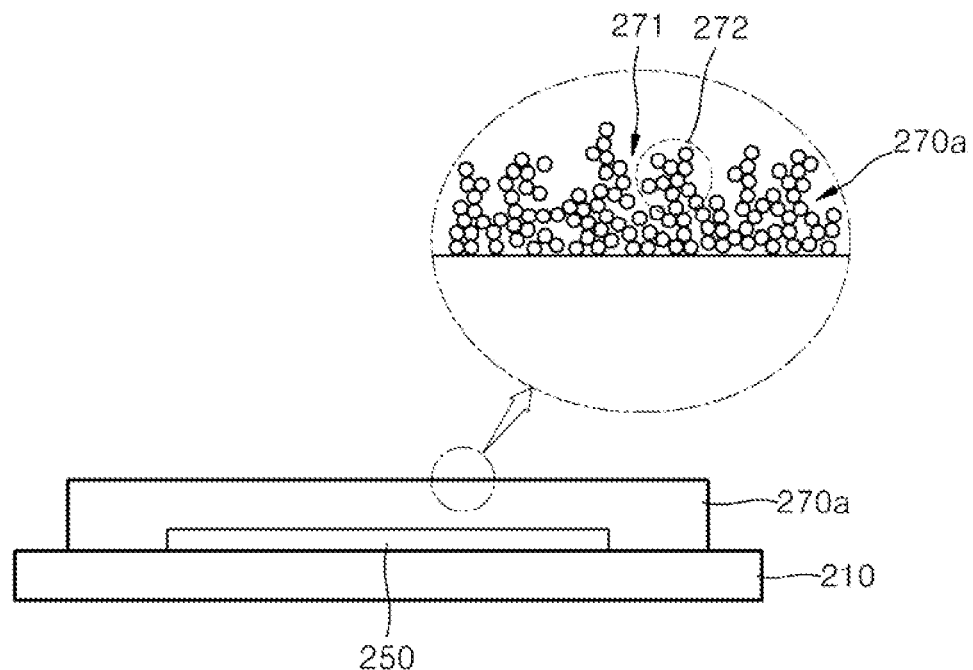

Referring to FIG. 3C, the pre-encapsulation layer 270a is formed on the organic light-emitting portion 250. The pre-encapsulation layer 270a encapsulates the organic light-emitting portion 250 by entirely covering the organic light-emitting portion 250. The pre-encapsulation layer 270a includes a low temperature viscosity transition (LVT) inorganic substance (hereinafter, referred to as the LVT inorganic substance). The LVT inorganic substance refers to an inorganic substance having a low viscosity change temperature.

In the present specification, the term "viscosity change temperature" does not signify a temperature at which viscosity of the LVT inorganic substance is completely changed from "solid" to "liquid", but signifies a minimum temperature at which fluidity may be provided to the LVT inorganic substance.

As described later, the LVT inorganic substance may be formed by first being made fluidic and then solidified. The viscosity change temperature of the LVT inorganic substance may be lower than a denaturation temperature of material included in the organic light-emitting portion 250.

The phrase "denaturation temperature of a material included in the organic light-emitting portion 250" may signify a temperature at which chemical and/or physical denaturation of the material included in the organic light-emitting portion 250 is caused. For example, the "denaturation temperature of a material included in the organic light-emitting portion 250" may signify a glass transition temperature of an organic substance included in the organic light-emitting layer 220 of the organic light-emitting portion 250. The glass transition temperature may be produced, for example, from a result of performing thermal analysis using thermo gravimetric analysis (TGA) and differential scanning calorimetry (DSC) on a material included in the organic light-emitting portion 250 (an $N_2$ environment, a temperature range: the room temperature to 600° C. (10° C./min)-TGA, from the room temperature to 400° C.-DSC, Pan Type: Pt Pan in one-time Al Pan (TGA), one-time Al pan (DSC)), which is obvious to one of ordinary skill in the art The denaturation temperature of the material included in the organic light-emitting portion 250 may exceed, for example, 130° C., but the present invention is not limited thereto. The denaturation temperature of the material included in the organic light-emitting portion 250 may be easily measured through TGA as described above with respect to the material included in the organic light-emitting portion 250.

In some embodiments, the viscosity change temperature of the LVT inorganic substance may be greater than or equal to 80° C., for example, 80° C. to 130° C., but the present invention is not limited thereto.

The LVT inorganic substance may be formed of one sort of a compound or a mixture formed of two or more sorts of compounds. The LVT inorganic substance may include tin oxide, for example, SnO or $SnO_2$. When the LVT inorganic substance includes SnO, the content of SnO may be 20 wt % to 100 wt %.

For example, the LVT inorganic substance may further include at least one type of phosphorus (P) oxide, for example, $P_2O_5$, boron (B) paste $BPO_4$, tin (Sn) fluoride, for example, $SnF_2$, niobium (Nb) oxide, for example, NbO, tungsten (W) oxide, for example, $WO_3$, zinc (Zn) oxide, for example, ZnO, and titanium (Ti) oxide, for example, $TiO_2$, but the present invention is not limited thereto. In some embodiments, the LVT inorganic substance may be tinphosphate glass SnO—$P_2O_5$.

For example, the LVT inorganic substance may include SnO; SnO and $P_2O_5$; SnO and $BPO_4$; SnO, $P_2O_5$, and NbO; or SnO, $P_2O_5$, and $WO_3$, but the present invention is not limited thereto.

For example, the LVT inorganic substance may have the following composition, but the present invention is not limited thereto.

1) SnO (100 wt %);
2) SnO (80 wt %) and $P_2O_5$ (20 wt %); and
3) SnO (90 wt %) and $BPO_4$ (10 wt %).

The thickness of the pre-encapsulation layer 270a may be 1 µm to 30 µm, for example, 1 µm to 5 µm. When the thickness of the pre-encapsulation layer 270a satisfies a range of 1 µm to 5 µm, a flexible OLED having a bending characteristic may be embodied.

The pre-encapsulation layer 270a may be formed by the facing target sputtering apparatus 1 of FIG. 1 according to the present embodiment. In this case, the first and second sputtering targets 111a and 111b include the LVT inorganic substance. Also, the first and second sputtering targets 111a and 111b may additionally include a conductive material to obtain conductivity.

In some embodiments, when the pre-encapsulation layer 270a is deposited, an oxygen injection rate is adjusted by the gas supply portion 30, thereby changing the composition of the LVT inorganic substance.

The pre-encapsulation layer 270a of FIG. 3C may include defects such as a film forming element 272 and a pinhole 271. The film forming element 272 denotes LVT inorganic substance agglutinated particles that fail to contribute to film formation during film formation of the LVT inorganic substance. The pinhole 271 denotes an empty area where the LVT inorganic substance is not provided. The generation of the film forming element 272 may contribute to the formation of the pinhole 271.

Figure 3D:
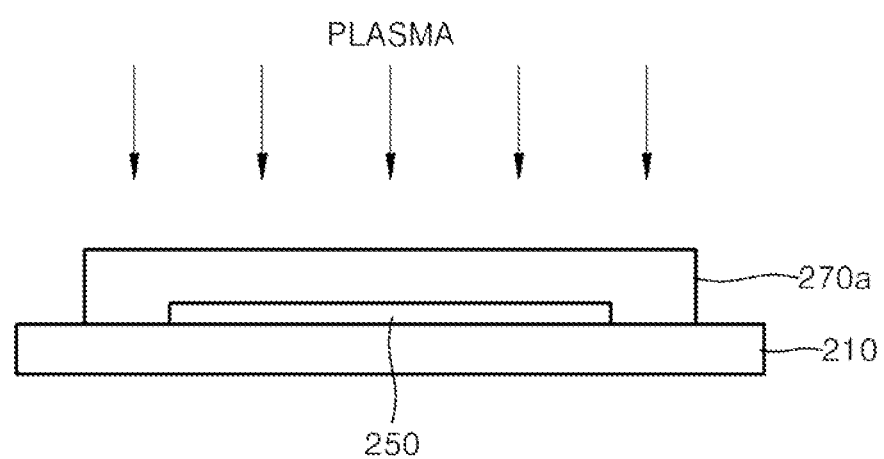

Referring to FIG. 3D, a second plasma surface process may be performed on the pre-encapsulation layer 270a. The second plasma surface process may be performed by the following operations.

First, the chamber 10 of FIG. 1 is turned to a vacuum state of $10^{-3}$ Pa or lower, and then Ar gas or oxygen ($O_2$) gas is injected into the chamber 10 to maintain a pressure of 30-100 Pa.

Next, a voltage of the sputtering power portion 50 is adjusted to be within a range in which, although plasma is generated, the film formation by the first and second sputtering targets 111a and 111b is not performed on the deposition target 20. In other words, since the energy of the generated plasma is low, even when the plasma collides against the first and second sputtering targets 111a and 111b, the materials of the first and second sputtering targets 111a and 111b may not be sputtered out therefrom.

Next, as a voltage is applied to the induced magnetic field coil 150, the plasma arrives at the deposition target 20, and thus the plasma surface process is available. The plasma surface process may be performed for about 30 to 60 minutes.

According to the above second plasma surface process, the defects such as the film forming element 272 and the pin hole 271 of FIG. 3C may be removed. As the plasma collides against the surface of the pre-encapsulation layer 270a, a surface tissue shape is changed and thus internal combination of the pre-encapsulation layer 270a may be facilitated.

To remove the defects of the pre-encapsulation layer 270a, an annealing process may be performed simultaneously or sequentially with the second plasma surface process. The defects such as the film forming element 272 and the pinhole 271, may be removed through the annealing process.

In the annealing process, an annealing temperature of the deposition target 20 of FIG. 1 may be adjusted by the temperature control unit 22 of the facing target sputtering apparatus 1 according to the present embodiment.

The annealing process is performed at a temperature over the viscosity change temperature of the LVT inorganic substance included in the pre-encapsulation layer 270a. The annealing process may be formed at a temperature at which the organic light-emitting portion 250 may not be damaged. For example, in the annealing process, the pre-encapsulation layer 270a may be thermally treated within a range over the viscosity change temperature of the LVT inorganic substance and less than the denaturation temperature of the material included in the organic light-emitting portion 250. The "viscosity change temperature of the LVT inorganic substance" varies according to the composition of the LVT inorganic substance, and the "denaturation of the material included in the organic light-emitting portion 250" may vary according to the material used for the organic light-emitting portion 250. However, the "viscosity change temperature of the LVT inorganic substance" and the "denaturation temperature of the material included in the organic light-emitting portion 250" may be easily recognized by one of ordinary skill in the art according to the composition of the LVT inorganic substance and the material used for the organic light-emitting portion 250. For example, the "viscosity change temperature of the LVT inorganic substance" or "denaturation temperature of the material included in the organic light-emitting portion 250" may be performed by a glass transition temperature (Tg) evaluation of an organic substance that is produced from a TGA analysis result with respect to the material included in the organic light-emitting portion 250.

In some embodiments, the annealing process may be performed by thermally treating the pre-encapsulation layer 270a at a temperature range of 80° C. to 130° C. for 1 to 3 hours, for example, at a temperature of 100° C. for 2 hours, but the present invention is not limited thereto. As the temperature of the annealing process satisfies the above range, flowability of the LVT inorganic substance of the 270a is possible, and the denaturation of the organic light-emitting portion 250 may be prevented.

In some embodiments, the annealing process may be performed in a vacuum environment or an inert gas environment, for example, an $N_2$ environment, an Ar environment, etc. In some embodiments, the annealing process may be performed in the facing target sputtering apparatus 1 of FIG. 1. The temperature control unit 22 may maintain an annealing temperature.

In the annealing process, the pinhole (not shown) in the pre-encapsulation layer 270a may be filled with the LVT inorganic substance or the film forming element (not shown) that flow into the pinhole. After the thermal treatment process, as a temperature deceases, the flowable LVT inorganic substance is changed to a solid statue.

Figure 3E:
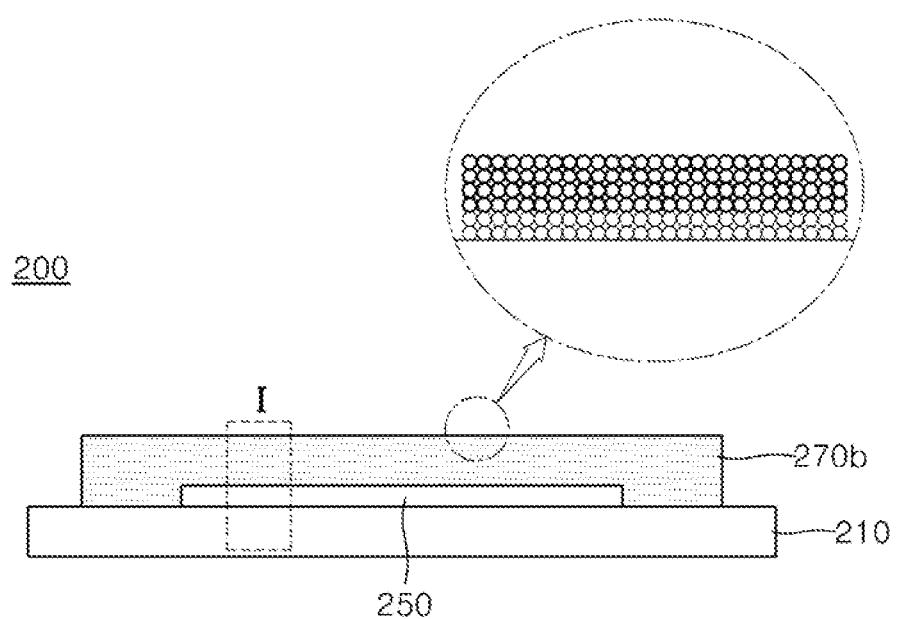

As a result, as illustrated in FIG. 3E, as the defects of the pre-encapsulation layer 270a are removed, the encapsulation layer 270b having a dense film quality may be formed.

FIG. 4 is an enlarged cross-sectional view of a portion I of FIG. 3E. Referring to FIG. 4, the organic light-emitting display apparatus 200 according to the present embodiment may include a substrate 210, a buffer layer 211, a thin film transistor TR, an OLED, a pixel define layer 219, and the encapsulation layer 270b.

The substrate 210 may be a glass substrate, but the present invention is not limited thereto and the substrate 210 may be formed of metal or plastic. The substrate 210 may be a flexible substrate capable of being bent.

The buffer layer 211 may prevent diffusion of impurity ions in the upper surface of the substrate 210, prevent intrusion of moisture or external air, and planarize the upper surface of the substrate 210. In some embodiments, the buffer layer 211 may be formed of an inorganic substance such as silicon oxide, silicon nitride, silicon oxynitride, aluminum oxide, aluminum nitride, titanium oxide, or titanium nitride, an organic substance such as polyimide, polyester, or acryl, or a stacked layer thereof. The buffer layer 211 is not an essential constituent element and may not be included if necessary.

The thin film transistor TR includes an active layer 212, a gate electrode 214, and source/drain electrodes 216 and 217. A gate insulation layer 213 for insulation between the gate electrode 214 and the active layer 212 is provided therebetween.

The active layer 212 may be provided on the buffer layer 211. An inorganic semiconductor such as amorphous silicon or poly silicon or an organic semiconductor may be used for the active layer 212. In some embodiments, the active layer 212 may be formed of an oxide semiconductor. For example, the oxide semiconductor may include oxide of a material selected from 12, 13, and 14 group metal elements such as zinc (Zn), indium (In), gallium (Ga), tin (Sn) cadmium (Cd), germanium (Ge), or hafnium (Hf).

The gate insulation layer 213 is provided on the buffer layer 211 covering the active layer 212 and the gate electrode 214 is formed on the gate insulation layer 213. An interlayer insulation layer 215 is formed on the gate insulation layer 213 to cover the gate electrode 214. The source electrode 216 and the drain electrode 217 are formed on the interlayer insulation layer 215 so as to contact the active layer 212 through contact holes.

The structure of the thin film transistor TR is not limited thereto and a variety of shapes of thin film transistor structures may be employed. For example, although the thin film transistor TR is formed in a top gate structure, it may be formed in a bottom gate structure in which the gate electrode 214 is arranged under the active layer 212.

A pixel circuit (not shown) including a capacitor may be formed with the thin film transistor TR. A planarization layer 218 covering the pixel circuit including the thin film transistor TR is provided on the interlayer insulation layer 215. The planarization layer 218 may remove steps and planarize a surface in order to improve a light emitting efficiency of the OLED that is provided on the planarization layer 218.

The planarization layer 218 may be formed of an inorganic substance and/or an organic substance. For example, the planarization layer 218 may include photoresist, acryl based polymer, polyimide based polymer, polyamide based polymer, siloxane based polymer, polymer containing a photosensitive acrylic carboxyl group, novolac resin, alkali soluble resin, silicon oxide, silicon nitride, silicon nitride acid, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc.

The OLED is arranged on the planarization layer 218 and includes the first electrode 221, the organic light-emitting layer 220, and the second electrode 222. The pixel define layer 219 is arranged on the planarization layer 218 and the first electrode 221 and defines a pixel area and a non-pixel area.

The organic light-emitting layer 220 may be formed of a low molecular or polymer organic substance. When a low molecular organic substance is used, a hole injection layer (HIL), a hole transport layer (HTL), an electron transport layer (ETL), and an electron injection layer (EIL) may be additionally formed to an emission layer (EML) in a monolayer or a multilayer structure. The low molecular organic substance may be formed by a vacuum deposition method. The EML may be independently formed in each of red (R), green (G), and blue (B) pixels. The HIL, HTL, ETL, and EIL may be commonly applied, as common layers, to the red (R), green (G), and blue (B) pixels.

When the organic light-emitting layer 220 is formed of a polymer organic substance, only the hole transport layer (HTL) may be included in a direction of the first electrode 221, with the emission layer as a center. The HTL may be formed on an upper surface of the first electrode 221 by an inkjet printing method or a spin coating method by using poly-(2,4)-ethylene-dihydroxy thiophene (PEDOT) or polyaniline (PANI). A poly-phenylenevinylene (PPV) based and polyfluorene based polymer organic substance may be used as an organic material. A color pattern may be formed by a typical method such as the inkjet printing method, the spin coating method, or a thermal transfer method using layer.

The hole injection layer (HIL) may be formed using a phthalocyanine compound such as copper phthalocyanine, or starburst-type amine such as TCTA, m-MTDATA, or m-MTDAPB.

The HTL may be formed of N,N'-bis(3-methylphenyl)-N,N-diphenyl-[1,1-biphenyl]-4,4'-diamine(TPD), N,N'-di(naphthalene-1-yl)-N,N'-diphenyl benzidine (α-NPD), etc. The EIL may be formed by using a material such as LiF, NaCl, CsF, $Li_2O$, BaO, Liq, etc. The ETL may be formed by using $Alq_3$. The EML may include a host material and a dopant material.

The host material may be tris(8-hydroxy-quinolinato) aluminum ($Alq_3$), 9,10-di(nafti-2-yl) anthracene (AND), 3-Tert-butyl-9,10-di(nafti-2-yl) anthracene (TBADN), 4,4'-bis(2,2-diphenyl-ethene-1-yl)-4,4'-dimethyl-phenyl(DPVBi), 4,4'-bis(2,2-diphenyl-ethene-1-yl)-4,4'-dimethyl-phenyl(p-DMDPVBi), Tert(9,9-diarylfluorene)s (TDAF), 2-(9,9'-spirobiindane-2-yl)-9,9'-spirobiindane(BSDF), 2,7-bis(9,9'-spirobiindane-2-yl)-9,9'-spirobiindane(TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4"-tris(carbazole-9-yl), triphenyl amine (TcTa), 4,4'-bis(carbazole-9-yl)biphenyl (CBP), 4,4'-bis(9-carbazole)-2,2'-dimethyl-biphenyl(CBDP), 4,4'-bis(carbazole-9-yl)-9,9-dimethyl-fluorene (DMFL-CBP), 4,4'-bis(carbazole-9-yl)-9,9-bis-bis(9-phenyl-9H-carbazole) fluorene (FL-4CBP), 4,4'-bis(carbazole-9-yl)-9,9-di-tolil-fluorene(DPFL-CBP), 9,9-bis(9-phenyl-9H-carbazole)fluorene (FL-2CBP), etc.

The dopant material may be DPVBi (4,4'-bis[4-(di-p-tolil amino)styryl]biphenyl), ADN (9,10-di(naph-2-thyl)anthracene), TBADN (3-tert-butyl-9,10-di(naph-2-thyl) anthracene), etc.

The first electrode 221 is arranged on the planarization layer 218 and may be electrically connected to the drain electrode 217 of the thin film transistor TR through a through hole 208 that penetrates the planarization layer 218.

The first electrode 221 may function as an anode electrode and the second electrode 222 may function as a cathode electrode. However, the present invention is not limited thereto and the polarities of the first and second electrodes 221 and 222, respectively, may be changed so long as they are opposite each other.

When the first electrode 221 functions as an anode electrode, the first electrode 221 may include indium tin oxide (ITO), indium zinc oxide (IZO), zinc oxide (ZnO), or indium oxide (In2O3) having a high work function.

When the organic light-emitting display apparatus 200 is of a front light-emitting type that presents an image in a reverse direction to the substrate 11, the first electrode 221 may further include a reflection layer (not shown) including silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca), etc. The first electrode 221 and the reflection layer may be used independently or may be combined with each other. Also, the first electrode 221 may be formed in a monolayer or multilayer structure including the above-described metal and/or alloy. In some embodiments, the first electrode 221 may be of a reflection type electrode and having an ITO/Ag/ITO structure.

When the second electrode 222 functions as a cathode electrode, the second electrode 222 may be formed of metal such as Ag, Mg, Al, Pt, Pd, Au, Ni, Nd, Ir, Cr, Li, or Ca. When the organic light-emitting display apparatus 200 is of a front light-emitting type, the second electrode 222 may be provided so as to be capable of performing light transmission. In some embodiments, the second electrode 222 may include transparent conductive metal oxide such as ITO, IZO, ZTO, ZnO, or $In_2O_3$.

In another embodiment, the second electrode 222 may be formed in a thin film including at least one material selected from Li, Ca, LiF/Ca, LiF/Al, Al, Ag, Mg, or Yb. For example, the second electrode 222 may be formed in a monolayer or multiplayer structure of Mg:Ag, Ag:Yb, and/or Ag. The second electrode 222 may be formed so as to have a common voltage applied to all pixels, unlike the first electrode 221.

The pixel define layer 219 has an opening portion exposing the first electrode 221 and defines a pixel area and a non-pixel area of the OLED. Although FIG. 4 illustrates only one opening portion, the pixel define layer 219 may have a plurality of opening portions. As the first electrode 221, the organic light-emitting layer 220, and the second electrode 222 are sequentially stacked in the opening portion of the pixel define layer 219, the organic light-emitting layer 220 may emit light. In other words, a portion where the pixel define layer 219 is formed is substantially the non-pixel area, and the opening portion of the pixel define layer 219 is substantially the pixel area.

As a plurality of opening portions are formed, the organic light-emitting display apparatus 200 may include a plurality of OLEDs. A pixel may be formed for each OLED and a color of red, green, blue, or white may be embodied for each pixel.

However, the present invention is not limited thereto. The organic light-emitting layer 220 may be commonly formed over the entire planarization layer 218, regardless of the position of a pixel. The organic light-emitting layer 220 may be formed as layers including light emitting materials emitting lights of red, green, and blue colors are vertically stacked. In another example for emitting the white light, the organic light-emitting layer 220 may include a structure in which at least a light-emitting substance emitting red light, a light-emitting substance emitting green light, and a light-emitting substance emitting blue light are mixed. If a white light may be emitted, a combination of other colors is possible. Also, a color conversion layer or a color filter for converting the emitted white light into a predetermined color may be further provided.

A protection layer 223 may be arranged on the OLED and the pixel define layer 219 to cover and protect the OLED. The protection layer 223 may use an inorganic insulation layer and/or an organic insulation layer. The inorganic insulation layer may include SiO2, SiNx, SiON, $Al_2O_3$, $TiO_2$, $Ta_2O_5$, $HfO_2$, $ZrO_2$, BST, PZT, etc. The organic insulation layer may include general purpose polymers (PMMA, PS), polymer derivatives having a phenol based group, acryl based polymers, imide based polymers, aryl ether based polymers, amide based polymers, fluorinated polymers, p-xylene based polymers, vinyl alcohol-based polymers, and blends thereof. The protection layer 223 may be deposited by a variety of deposition methods such as a plasma enhanced chemical vapor deposition (PECVD) method, an atmospheric pressure CVD (APCVD) method, a low pressure CVD (LPCVD) method, etc.

The encapsulation layer 270b is arranged on the OLED as described above and prevents intrusion of external oxygen or moisture into the OLED. The encapsulation layer 270b including an LVT material may reduce denaturation of the OLED during encapsulation.

As described above, in the facing target sputtering apparatus 1, the organic light-emitting layer 220, and a method of manufacturing the same, according to the one or more of the above embodiments of the present invention, since the facing target sputtering apparatus 1 includes an induced magnetic field coil 150, after an encapsulation layer of an organic light-emitting display apparatus is formed, a plasma surface process may be performed on the encapsulation layer in the same apparatus. Accordingly, the formation of an encapsulation layer including a low temperature viscosity change inorganic substance may be facilitated. Also, since a plasma surface process may be performed on the organic light-emitting portion before the deposition of the encapsulation layer, surface adhesion is improved and thus an encapsulation layer having a superior encapsulation characteristic may be formed.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and detail may be made therein without departing from the spirit and scope of the present invention as defined by the following claims.

What is claimed is:

1. A method of manufacturing an organic light-emitting display apparatus, the method comprising the steps of:
preparing a deposition target in which an organic light-emitting portion is formed on a substrate;
forming a pre-encapsulation layer for encapsulating the organic light-emitting portion by using a facing target sputtering apparatus; and
forming an encapsulation layer by performing a plasma surface process on the pre-encapsulation layer by using the facing target sputtering apparatus;
wherein the facing target sputtering apparatus comprises:
a chamber in which a mounting portion for accommodating the deposition target is provided;
a gas supply portion facing the mounting portion and supplying gas to the chamber;
a first target portion and a second target portion disposed in the chamber and facing each other; and
an induced magnetic field coil surrounding the exterior of the chamber.

2. The method of claim 1, wherein the first target portion and the second target portion are separated from each other, and the gas supplied by the gas supply portion passes between the first target portion and the second target portion.

3. The method of claim 1, wherein the induced magnetic field coil is provided at a position corresponding to the first target portion and the second target portion.

4. The method of claim 1, wherein each of the first target portion and the second target portion comprises:
a target plate for accommodating a sputtering target;
a yoke disposed at a rear surface of the target plate; and
a magnetic field generation unit disposed at a rear surface of the yoke.

5. The method of claim 4, wherein the yoke is formed of one of a ferromagnetic body and a paramagnetic body.

6. The method of claim 4, wherein the yoke is formed of any one of iron (Fe), cobalt (Co), nickel (Ni), and an alloy thereof.

7. The method of claim 1, wherein the accommodation unit further comprises a temperature control unit for controlling a temperature of the deposition target.

8. The method of claim 1, wherein the encapsulation layer comprises an inorganic substance having a low viscosity change temperature at which fluidity is provided to the inorganic substance.

9. The method of claim 8, wherein the viscosity change temperature is not less than 80° C.

10. The method of claim 9, wherein the viscosity change temperature ranges from 80° C. to 130° C.

11. The method of claim 1, wherein the encapsulation layer comprises tin oxide.

12. The method of claim 1, wherein the encapsulation layer comprises an inorganic substance having a low viscosity change temperature at which fluidity is provided to the inorganic substance, and a viscosity change temperature of the inorganic substance is lower than a denaturation temperature of the organic light-emitting portion.

13. The method of claim 12, wherein the viscosity change temperature is not less than 80° C.

14. The method of claim 13, wherein the viscosity change temperature ranges from 80° C. to 130° C.

15. A method of manufacturing an organic light-emitting display apparatus, the method comprising the steps of:
preparing a deposition target in which an organic light-emitting portion is formed on a substrate;
forming a pre-encapsulation layer for encapsulating the organic light-emitting portion by using a facing target sputtering apparatus; and
forming an encapsulation layer by performing a plasma surface process on the pre-encapsulation layer by using the facing target sputtering apparatus;
wherein the facing target sputtering apparatus comprises:
a chamber in which a mounting portion for accommodating the deposition target is provided;
a gas supply portion facing the mounting portion and supplying gas to the chamber;
a first target portion and a second target portion disposed in the chamber and facing each other; and
an induced magnetic field coil surrounding the exterior of the chamber;
said method further comprising the step of performing a plasma surface process on the organic light-emitting portion before the forming of the pre-encapsulation layer.

16. A method of manufacturing an organic light-emitting display apparatus, the method comprising the steps of:
preparing a deposition target in which an organic light-emitting portion is formed on a substrate;
forming a pre-encapsulation layer for encapsulating the organic light-emitting portion by using a facing target sputtering apparatus; and
forming an encapsulation layer by performing a plasma surface process on the pre-encapsulation layer by using the facing target sputtering apparatus;
wherein the facing target sputtering apparatus comprises:
a chamber in which a mounting portion for accommodating the deposition target is provided;
a gas supply portion facing the mounting portion and supplying gas to the chamber;
a first target portion and a second target portion disposed in the chamber and facing each other; and
an induced magnetic field coil surrounding the exterior of the chamber;
wherein the forming of the encapsulation layer further comprises performing an annealing process for thermally treating the pre-encapsulation layer.

17. The method of claim 16, wherein the plasma surface process on the pre-encapsulation layer and the annealing process are performed at the same time.

* * * * *